United States Patent
Kim et al.

(10) Patent No.: US 9,923,668 B2
(45) Date of Patent: Mar. 20, 2018

(54) CODED MODULATION ARCHITECTURE USING SPARSE REGRESSION CODES

(71) Applicant: Samsung Electronics Co., Ltd, Suwon-si (KR)

(72) Inventors: Muryong Kim, Austin, TX (US); Eran Pisek, Plano, TX (US); Shadi Abu-Surra, Plano, TX (US)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 57 days.

(21) Appl. No.: 15/004,815

(22) Filed: Jan. 22, 2016

(65) Prior Publication Data

US 2017/0054453 A1 Feb. 23, 2017

Related U.S. Application Data

(60) Provisional application No. 62/208,165, filed on Aug. 21, 2015.

(51) Int. Cl.

| | |
|---|---|
| H04L 1/18 | (2006.01) |
| H04L 1/00 | (2006.01) |
| H04B 7/06 | (2006.01) |
| H03M 13/11 | (2006.01) |

(52) U.S. Cl.
CPC ....... *H04L 1/0045* (2013.01); *H03M 13/1102* (2013.01); *H03M 13/1191* (2013.01); *H04B 7/0615* (2013.01); *H04L 1/0003* (2013.01); *H04L 1/0009* (2013.01); *H04L 1/0041* (2013.01); *H04L 1/0058* (2013.01)

(58) Field of Classification Search
CPC ............ H03M 13/2792; H04B 7/0615; H04L 1/0041; H04L 1/0045
See application file for complete search history.

(56) References Cited

U.S. PATENT DOCUMENTS

| | | | | |
|---|---|---|---|---|
| 6,307,868 B1 * | 10/2001 | Rakib | ................ | H03M 13/256 348/E7.07 |
| 6,937,617 B2 * | 8/2005 | Rakib | ................ | H03M 13/256 348/E7.07 |
| 7,219,289 B2 * | 5/2007 | Dickson | .............. | G06F 11/1076 714/752 |

(Continued)

OTHER PUBLICATIONS

The International Searching Authority, "International Search Report," International Application No. PCT/KR2016/009161, dated Nov. 30, 2016, 3 pages, publisher The ISA/KR, International Application Division, Korean Intellectual Property Office, Daejeon, Republic of Korea.

(Continued)

*Primary Examiner* — Esaw Abraham

(57) ABSTRACT

A communication system is configured to use coded modulation architecture using sparse regression codes. A transmitter includes a plurality of antenna and processing circuitry configured to: divide a data signal into a plurality of layers, allocate power individually to each of the plurality layers, encode a subset of the plurality of layers, the subset comprising a number of layers less than the whole, and interleave the subset of the plurality of layers. A receiver includes a plurality of antenna and processing circuitry configured to divide a received data signal into a plurality of layers and perform layer-by-layer decoding on the received data and control signals.

10 Claims, 10 Drawing Sheets

(56) References Cited

U.S. PATENT DOCUMENTS

| | | | | |
|---|---|---|---|---|
| 8,184,681 B2* | 5/2012 | Binder | ............... | H04B 7/15542 |
| | | | | 307/424 |
| 8,184,726 B2* | 5/2012 | Hsiao | ................... | H04B 7/0617 |
| | | | | 375/260 |
| 8,369,774 B2* | 2/2013 | Eberlein | ................ | H04H 20/06 |
| | | | | 455/12.1 |
| 8,811,509 B2* | 8/2014 | Shen | .................... | H04L 1/0058 |
| | | | | 332/103 |
| 9,130,635 B2* | 9/2015 | Sawai | ................... | H04B 7/0413 |
| 9,524,210 B1* | 12/2016 | Asnaashari | .......... | G06F 11/1044 |
| 9,578,604 B2* | 2/2017 | Chen | .................... | H04B 7/0434 |
| 2008/0165889 A1 | 7/2008 | Shapiro | | |
| 2010/0232535 A1* | 9/2010 | Yue | ....................... | H04L 1/0048 |
| | | | | 375/267 |
| 2010/0284491 A1 | 11/2010 | Chen et al. | | |

OTHER PUBLICATIONS

The International Searching Authority, "Written Opinion," International Application No. PCT/KR2016/009161, Nov. 30, 2016, 8 pages, publisher The ISA/KR, International Application Division, Korean Intellectual Property Office, Daejeon, Republic of Korea.

Cynthia Rush, et al., "Capacity-achieving Sparse Superposition Codes via Approximate Message Passing Decoding," arXiv:1501.05892v1 [cs. IT], Jan. 23, 2015, 47 pages.

Albert No, et al., "Complexity and Rate-Distortion Tradeoff via Successive Refinement," 2013 51st Annual Allerton Conference, Oct. 4, 2013, pp. 1531-1536, publisher IEEE, Piscataway, NJ.

* cited by examiner

CODED MODULATION ARCHITECTURE USING SPARSE REGRESSION CODES

CROSS-REFERENCE TO RELATED APPLICATION(S) AND CLAIM OF PRIORITY

This application claims priority under 35 U.S.C. § 119(e) to U.S. Provisional Patent Application No. 62/208,165 filed on Aug. 21, 2015 and entitled "CODED MODULATION ARCHITECTURE USING SPARSE REGRESSION CODES." The above-identified provisional patent application is hereby incorporated by reference in its entirety.

TECHNICAL FIELD

This disclosure relates generally to wireless communications. More specifically, this disclosure relates to coded modulation architecture using sparse regression codes.

BACKGROUND

In current wireless communication standards, coded modulation is used to transmit information with high spectral efficiency over band-limited channels. Coded modulation is limited in that: 1) it has a small and fixed number of MCS levels; 2) for each MCS, a fixed code rate is used regardless of small-scale SNR change; and 3) modulation order higher than 64-QAM is not preferred.

SUMMARY

This disclosure provides a coded modulation architecture using sparse regression codes.

In a first embodiment, a transmitter is provided. The transmitter includes a plurality of antenna configured to transmit data and control signals. The transmitter also includes processing circuitry configured to: divide a data signal into a plurality of layers, allocate power individually to each of the plurality layers, encode a subset of the plurality of layers, the subset comprising a number of layers less than the whole, and interleave the subset of the plurality of layers.

In a second embodiment, a receiver is provided. The receiver includes a plurality of antenna configured to receive data and control signals. The receiver also includes processing circuitry configured to divide a received data signal into a plurality of layers and perform layer-by-layer decoding on the received data and control signals.

In a third embodiment, a method is provided. The method includes dividing, by a transmitter, a data signal into a plurality of layers. The method also includes allocating power individually to each of the plurality layers. The method further includes encoding a subset of the plurality of layers, the subset comprising a number of layers less than the whole and interleaving the subset of the plurality of layers.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, whether or not those elements are in physical contact with one another. The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system or part thereof that controls at least one operation. Such a controller may be implemented in hardware or a combination of hardware and software and/or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of this disclosure and its advantages, reference is now made to the following description, taken in conjunction with the accompanying drawings, in which.

DETAILED DESCRIPTION

FIGS. 1 through 15B, discussed below, and the various embodiments used to describe the principles of the present invention in this patent document are by way of illustration only and should not be construed in any way to limit the scope of the disclosure. Those skilled in the art will understand that the principles of this disclosure may be implemented in any suitably arranged device or system.

Figure 1:
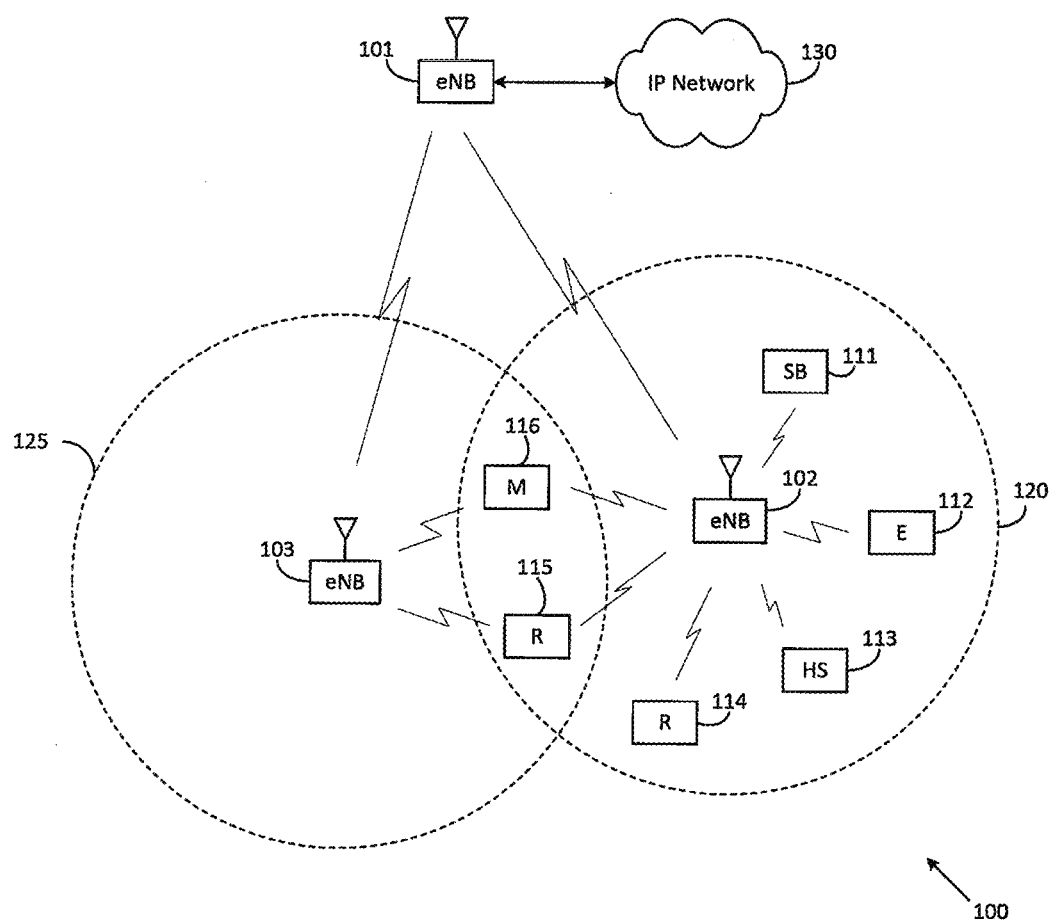
FIG. 1 illustrates an example wireless network according to this disclosure.

FIG. 1 illustrates an example wireless network 100 according to this disclosure. The embodiment of the wireless network 100 shown in FIG. 1 is for illustration only. Other embodiments of the wireless network 100 could be used without departing from the scope of this disclosure.

As shown in FIG. 1, the wireless network 100 includes an eNodeB (eNB) 101, an eNB 102, and an eNB 103. The eNB 101 communicates with the eNB 102 and the eNB 103. The eNB 101 also communicates with at least one Internet Protocol (IP) network 130, such as the Internet, a proprietary IP network, or other data network.

Depending on the network type, other well-known terms may be used instead of "eNodeB" or "eNB," such as "base station" or "access point." For the sake of convenience, the terms "eNodeB" and "eNB" are used in this patent document to refer to network infrastructure components that provide wireless access to remote terminals. Also, depending on the network type, other well-known terms may be used instead of "user equipment" or "UE," such as "mobile station," "subscriber station," "remote terminal," "wireless terminal," or "user device." For the sake of convenience, the terms "user equipment" and "UE" are used in this patent document to refer to remote wireless equipment that wirelessly accesses an eNB, whether the UE is a mobile device (such as a mobile telephone or smartphone) or is normally considered a stationary device (such as a desktop computer or vending machine).

The eNB 102 provides wireless broadband access to the network 130 for a first plurality of user equipments (UEs) within a coverage area 120 of the eNB 102. The first plurality of UEs includes a UE 111, which may be located in a small business (SB); a UE 112, which may be located in an enterprise (E); a UE 113, which may be located in a WiFi hotspot (HS); a UE 114, which may be located in a first residence (R); a UE 115, which may be located in a second residence (R); and a UE 116, which may be a mobile device (M) like a cell phone, a wireless laptop, a wireless PDA, or the like. The eNB 103 provides wireless broadband access to the network 130 for a second plurality of UEs within a coverage area 125 of the eNB 103. The second plurality of UEs includes the UE 115 and the UE 116. In some embodiments, one or more of the eNBs 101-103 may communicate with each other and with the UEs 111-116 using 5G, LTE, LTE-A, WiMAX, or other advanced wireless communication techniques.

Dotted lines show the approximate extents of the coverage areas 120 and 125, which are shown as approximately circular for the purposes of illustration and explanation only. It should be clearly understood that the coverage areas associated with eNBs, such as the coverage areas 120 and 125, may have other shapes, including irregular shapes, depending upon the configuration of the eNBs and variations in the radio environment associated with natural and man-made obstructions.

As described in more detail below, one or more of eNBs 101-103 includes a coded modulation architecture using sparse regression codes. In addition, one or more of UEs 111-116 includes a coded modulation architecture using sparse regression codes.

Although FIG. 1 illustrates one example of a wireless network 100, various changes may be made to FIG. 1. For example, the wireless network 100 could include any number of eNBs and any number of UEs in any suitable arrangement. Also, the eNB 101 could communicate directly with any number of UEs and provide those UEs with wireless broadband access to the network 130. Similarly, each eNB 102-103 could communicate directly with the network 130 and provide UEs with direct wireless broadband access to the network 130. Further, the eNB 101, 102, and/or 103 could provide access to other or additional external networks, such as external telephone networks or other types of data networks.

Figure 2A:
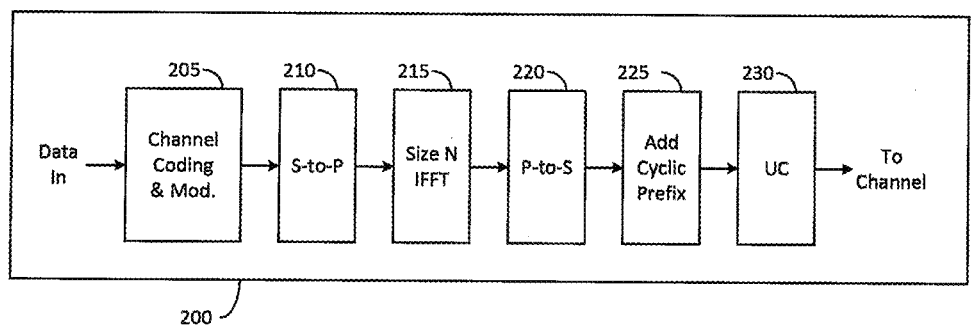
FIGS. 2A and 2B illustrate example wireless transmit and receive paths according to this disclosure.
Figure 2B:
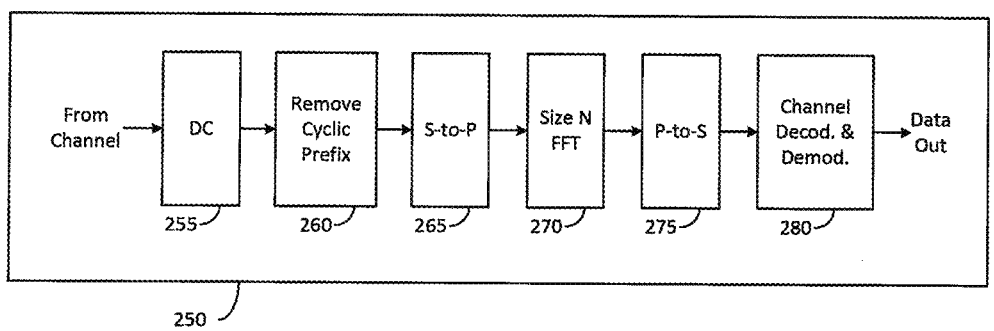

FIGS. 2A and 2B illustrate example wireless transmit and receive paths according to this disclosure. In the following description, a transmit path 200 may be described as being implemented in an eNB (such as eNB 102), while a receive path 250 may be described as being implemented in a UE (such as UE 116). However, it will be understood that the receive path 250 could be implemented in an eNB and that the transmit path 200 could be implemented in a UE. In some embodiments, the transmit path 200 and receive path 250 include a coded modulation architecture using sparse regression codes.

The transmit path 200 includes a channel coding and modulation block 205, a serial-to-parallel (S-to-P) block 210, a size N Inverse Fast Fourier Transform (IFFT) block 215, a parallel-to-serial (P-to-S) block 220, an add cyclic prefix block 225, and an up-converter (UC) 230. The receive path 250 includes a down-converter (DC) 255, a remove cyclic prefix block 260, a serial-to-parallel (S-to-P) block 265, a size N Fast Fourier Transform (FFT) block 270, a parallel-to-serial (P-to-S) block 275, and a channel decoding and demodulation block 280.

In the transmit path 200, the channel coding and modulation block 205 receives a set of information bits, applies coding (such as a low-density parity check (LDPC) coding), and modulates the input bits (such as with Quadrature Phase Shift Keying (QPSK) or Quadrature Amplitude Modulation (QAM)) to generate a sequence of frequency-domain modulation symbols. The serial-to-parallel block 210 converts (such as de-multiplexes) the serial modulated symbols to parallel data in order to generate N parallel symbol streams, where N is the IFFT/FFT size used in the eNB 102 and the UE 116. The size N IFFT block 215 performs an IFFT operation on the N parallel symbol streams to generate time-domain output signals. The parallel-to-serial block 220 converts (such as multiplexes) the parallel time-domain output symbols from the size N IFFT block 215 in order to generate a serial time-domain signal. The add cyclic prefix block 225 inserts a cyclic prefix to the time-domain signal. The up-converter 230 modulates (such as up-converts) the output of the add cyclic prefix block 225 to an RF frequency for transmission via a wireless channel. The signal may also be filtered at baseband before conversion to the RF frequency.

A transmitted RF signal from the eNB 102 arrives at the UE 116 after passing through the wireless channel, and reverse operations to those at the eNB 102 are performed at the UE 116. The down-converter 255 down-converts the received signal to a baseband frequency, and the remove cyclic prefix block 260 removes the cyclic prefix to generate a serial time-domain baseband signal. The serial-to-parallel block 265 converts the time-domain baseband signal to parallel time domain signals. The size N FFT block 270 performs an FFT algorithm to generate N parallel frequency-domain signals. The parallel-to-serial block 275 converts the parallel frequency-domain signals to a sequence of modulated data symbols. The channel decoding and demodulation block 280 demodulates and decodes the modulated symbols to recover the original input data stream.

Each of the eNBs 101-103 may implement a transmit path 200 that is analogous to transmitting in the downlink to UEs 111-116 and may implement a receive path 250 that is analogous to receiving in the uplink from UEs 111-116. Similarly, each of UEs 111-116 may implement a transmit path 200 for transmitting in the uplink to eNBs 101-103 and may implement a receive path 250 for receiving in the downlink from eNBs 101-103.

Each of the components in FIGS. 2A and 2B can be implemented using only hardware or using a combination of hardware and software/firmware. As a particular example, at least some of the components in FIGS. 2A and 2B may be implemented in software, while other components may be implemented by configurable hardware or a mixture of software and configurable hardware. For instance, the FFT block 270 and the IFFT block 215 may be implemented as configurable software algorithms, where the value of size N may be modified according to the implementation.

Furthermore, although described as using FFT and IFFT, this is by way of illustration only and should not be construed to limit the scope of this disclosure. Other types of transforms, such as Discrete Fourier Transform (DFT) and Inverse Discrete Fourier Transform (IDFT) functions, could be used. It will be appreciated that the value of the variable N may be any integer number (such as 1, 2, 3, 4, or the like) for DFT and IDFT functions, while the value of the variable N may be any integer number that is a power of two (such as 1, 2, 4, 8, 16, or the like) for FFT and IFFT functions.

Although FIGS. 2A and 2B illustrate examples of wireless transmit and receive paths, various changes may be made to FIGS. 2A and 2B. For example, various components in FIGS. 2A and 2B could be combined, further subdivided, or omitted and additional components could be added according to particular needs. Also, FIGS. 2A and 2B are meant to illustrate examples of the types of transmit and receive paths that could be used in a wireless network. Any other suitable architectures could be used to support wireless communications in a wireless network.

Figure 3:
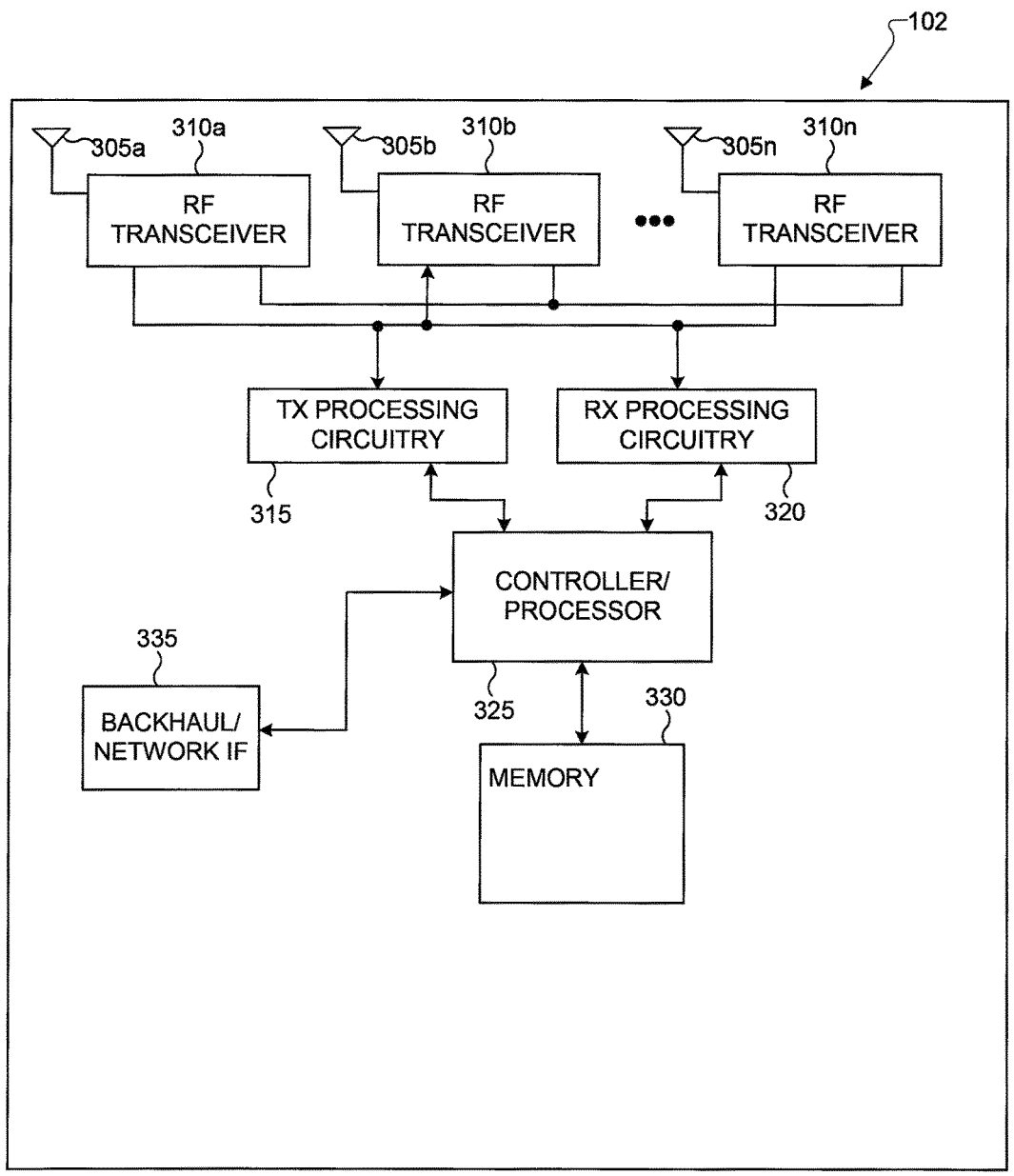
FIG. 3 illustrates an example base station according to this disclosure.

FIG. 3 illustrates an example eNB 102 according to this disclosure. The embodiment of the eNB 102 shown in FIG. 3 is for illustration only, and other eNBs of FIG. 1 could have the same or similar configuration. However, eNBs come in a wide variety of configurations, and FIG. 3 does not limit the scope of this disclosure to any particular implementation of an eNB.

As shown in FIG. 3, the eNB 102 includes multiple antennas 305a-305n, multiple RF transceivers 310a-310n, transmit (TX) processing circuitry 315, and receive (RX) processing circuitry 320. The eNB 102 also includes a controller/processor 325, a memory 330, and a backhaul or network interface 335.

The RF transceivers 310a-310n receive, from the antennas 305a-305n, incoming RF signals, such as signals transmitted by UEs or other eNBs. The RF transceivers 310a-310n down-convert the incoming RF signals to generate IF or baseband signals. The IF or baseband signals are sent to the RX processing circuitry 320, which generates processed baseband signals by filtering, decoding, and/or digitizing the baseband or IF signals. The RX processing circuitry 320 transmits the processed baseband signals to the controller/processor 325 for further processing.

The TX processing circuitry 315 receives analog or digital data (such as voice data, web data, e-mail, or interactive video game data) from the controller/processor 325. The TX processing circuitry 315 encodes, multiplexes, and/or digitizes the outgoing baseband data to generate processed baseband or IF signals. The RF transceivers 310a-310n receive the outgoing processed baseband or IF signals from the TX processing circuitry 315 and up-converts the baseband or IF signals to RF signals that are transmitted via the antennas 305a-305n.

The controller/processor 325 can include one or more processors or other processing devices that control the overall operation of the eNB 102. For example, the controller/processor 325 could control the reception of forward channel signals and the transmission of reverse channel signals by the RF transceivers 310a-310n, the RX processing circuitry 320, and the TX processing circuitry 315 in accordance with well-known principles. The controller/processor 325 could support additional functions as well, such as more advanced wireless communication functions. For instance, the controller/processor 325 could apply a coded modulation architecture using sparse regression codes. Any of a wide variety of other functions could be supported in the eNB 102 by the controller/processor 325. In some embodiments, the controller/processor 325 includes at least one microprocessor or microcontroller.

The controller/processor 325 is also capable of executing programs and other processes resident in the memory 330, such as a basic OS. The controller/processor 325 can move data into or out of the memory 330 as required by an executing process.

The controller/processor 325 is also coupled to the backhaul or network interface 335. The backhaul or network interface 335 allows the eNB 102 to communicate with other devices or systems over a backhaul connection or over a network. The interface 335 could support communications over any suitable wired or wireless connection(s). For example, when the eNB 102 is implemented as part of a cellular communication system (such as one supporting 5G, LTE, or LTE-A), the interface 335 could allow the eNB 102 to communicate with other eNBs over a wired or wireless backhaul connection. When the eNB 102 is implemented as an access point, the interface 335 could allow the eNB 102 to communicate over a wired or wireless local area network or over a wired or wireless connection to a larger network (such as the Internet). The interface 335 includes any suitable structure supporting communications over a wired or wireless connection, such as an Ethernet or RF transceiver.

The memory 330 is coupled to the controller/processor 325. Part of the memory 330 could include a RAM, and another part of the memory 330 could include a Flash memory or other ROM.

As described in more detail below, the transmit and receive paths of the eNB 102 (implemented using the RF transceivers 310a-310n, TX processing circuitry 315, and/or RX processing circuitry 320) support communication with aggregation of FDD cells and TDD cells.

Although FIG. 3 illustrates one example of an eNB 102, various changes may be made to FIG. 3. For example, the eNB 102 could include any number of each component shown in FIG. 3. As a particular example, an access point could include a number of interfaces 335, and the controller/processor 325 could support routing functions to route data between different network addresses. As another particular example, while shown as including a single instance of TX processing circuitry 315 and a single instance of RX processing circuitry 320, the eNB 102 could include multiple instances of each (such as one per RF transceiver).

Figure 4:
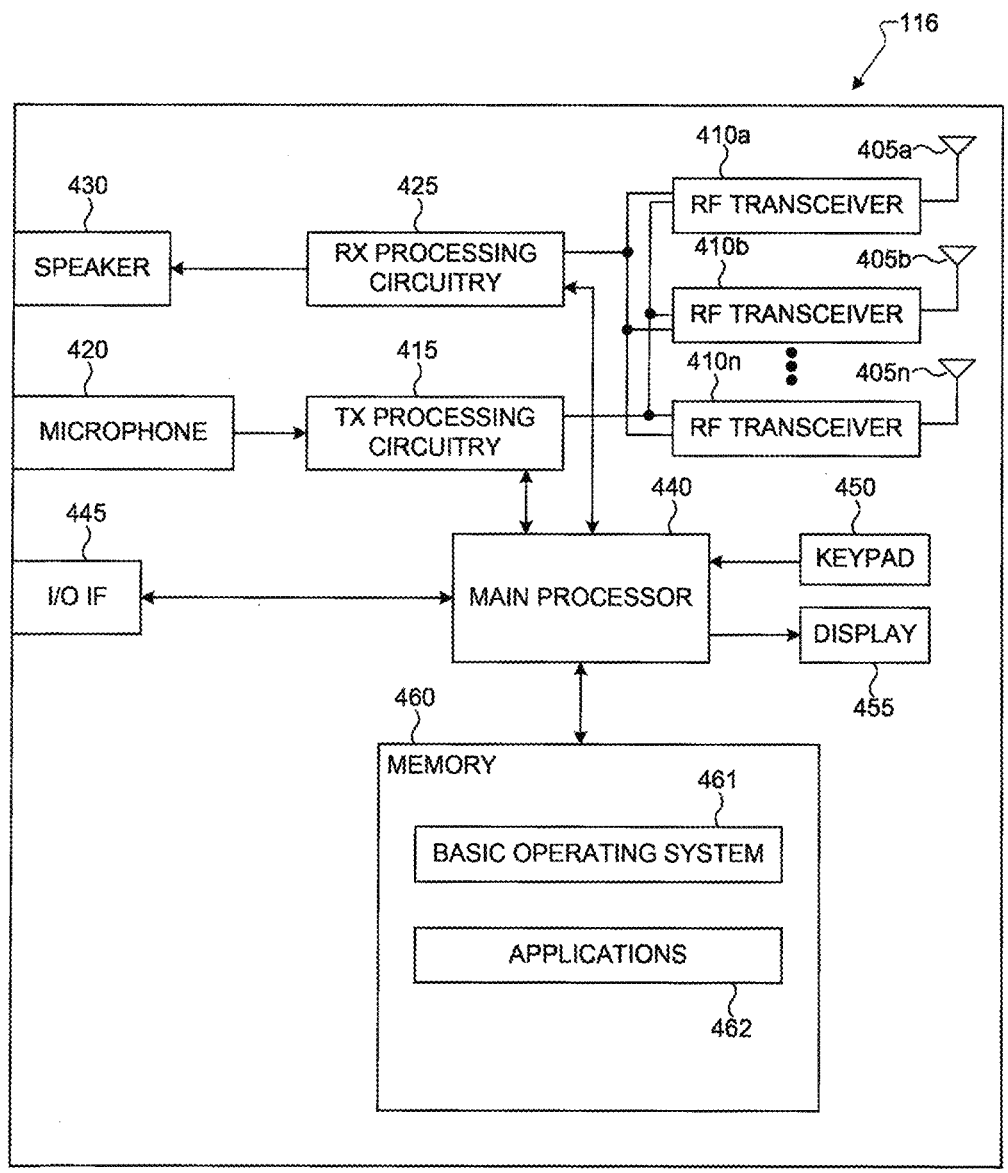
FIG. 4 illustrates an example user equipment according to this disclosure.

FIG. 4 illustrates an example UE 116 according to this disclosure. The embodiment of the UE 116 illustrated in FIG. 4 is for illustration only, and the UEs 111-115 of FIG. 1A could have the same or similar configuration. However, UEs come in a wide variety of configurations, and FIG. 4 does not limit the scope of this disclosure to any particular implementation of a UE.

The UE 116 includes multiple antennas 405a-405n, radio frequency (RF) transceivers 410a-410n, transmit (TX) processing circuitry 415, a microphone 420, and receive (RX) processing circuitry 425. The TX processing circuitry 415 and RX processing circuitry 425 are respectively coupled to each of the RF transceivers 410a-410n, for example, coupled to RF transceiver 410a, RF transceiver 410b through to a $N^{th}$ RF transceiver 410n, which are coupled respectively to antenna 405a, antenna 405b and an $N^{th}$ antenna 405n. In certain embodiments, the UE 116 includes a single antenna 405a and a single RF transceiver 410a. The UE 116 also includes a speaker 430, a main processor 440, an input/output (I/O) interface (IF) 445, a keypad 450, a display 455, and a memory 460. The memory 460 includes a basic operating system (OS) program 461 and one or more applications 462.

The RF transceivers 410a-410n receive, from respective antennas 405a-405n, an incoming RF signal transmitted by an eNB or AP of the network 100. In certain embodiments, each of the RF transceivers 410a-410n and respective antennas 405a-405n is configured for a particular frequency band or technological type. For example, a first RF transceiver 410a and antenna 405a can be configured to communicate via a near-field communication, such as BLUETOOTH®, while a second RF transceiver 410b and antenna 405b can be configured to communicate via a IEEE 802.11 communication, such as Wi-Fi, and another RF transceiver 410n and antenna 405n can be configured to communicate via cellular communication, such as 3G, 4G, 5G, LTE, LTE-A, or WiMAX. In certain embodiments, one or more of the RF transceivers 410a-410n and respective antennas 405a-405n is configured for a particular frequency band or same technological type. The RF transceivers 410a-410n down-converts the incoming RF signal to generate an intermediate frequency (IF) or baseband signal. The IF or baseband signal is sent to the RX processing circuitry 425, which generates a processed baseband signal by filtering, decoding, and/or digitizing the baseband or IF signal. The RX processing circuitry 425 transmits the processed baseband signal to the speaker 330 (such as for voice data) or to the main processor 440 for further processing (such as for web browsing data).

The TX processing circuitry 415 receives analog or digital voice data from the microphone 420 or other outgoing baseband data (such as web data, e-mail, or interactive video game data) from the main processor 440. The TX processing circuitry 415 encodes, multiplexes, and/or digitizes the outgoing baseband data to generate a processed baseband or IF signal. The RF transceivers 410a-410n receive the outgoing processed baseband or IF signal from the TX processing circuitry 415 and up-converts the baseband or IF signal to an RF signal that is transmitted via one or more of the antennas 405a-405n.

The main processor 440 can include one or more processors or other processing devices and execute the basic OS program 461 stored in the memory 460 in order to control the overall operation of the UE 116. For example, the main processor 440 could control the reception of forward channel signals and the transmission of reverse channel signals by the RF transceivers 410a-410n, the RX processing circuitry 425, and the TX processing circuitry 415 in accordance with well-known principles. In some embodiments, the main processor 440 includes at least one microprocessor or microcontroller.

The main processor 440 is also capable of executing other processes and programs resident in the memory 460, such as operations for applying a coded modulation architecture using sparse regression codes. The main processor 440 can move data into or out of the memory 460 as required by an executing process. In some embodiments, the main processor 440 is configured to execute the applications 462 based on the OS program 461 or in response to signals received from eNBs or an operator. The main processor 440 is also coupled to the I/O interface 445, which provides the UE 116 with the ability to connect to other devices such as laptop computers and handheld computers. The I/O interface 445 is the communication path between these accessories and the main controller 440.

The main processor 340 is also coupled to the keypad 450 and the display unit 455. The user of the UE 116 can use the keypad 450 to enter data into the UE 116. The display unit 455 can be a liquid crystal display or other display capable of rendering text or at least limited graphics, such as from web sites, or a combination thereof.

The memory 460 is coupled to the main processor 440. Part of the memory 460 could include a random access memory (RAM), and another part of the memory 460 could include a Flash memory or other read-only memory (ROM).

Although FIG. 4 illustrates one example of UE 116, various changes may be made to FIG. 4. For example, various components in FIG. 4 could be combined, further subdivided, or omitted and additional components could be added according to particular needs. As a particular example, the main processor 440 could be divided into multiple processors, such as one or more central processing units (CPUs) and one or more graphics processing units (GPUs). Also, while FIG. 4 illustrates the UE 116 configured as a mobile telephone or smartphone, UEs could be configured to operate as other types of mobile or stationary devices.

Figure 5:
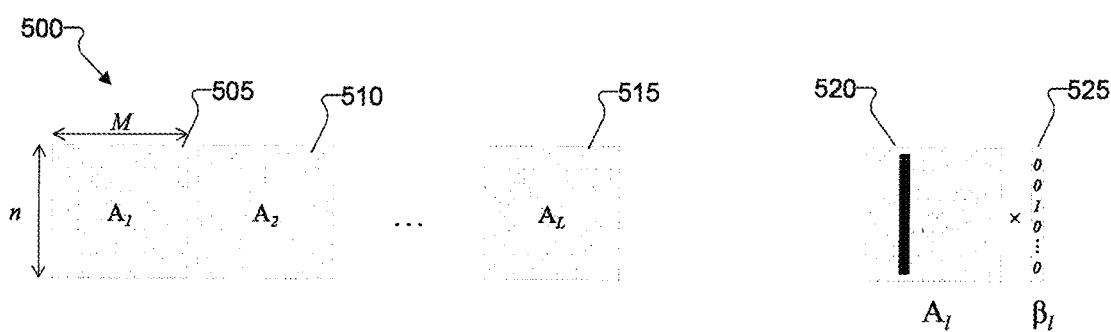
FIG. 5 illustrates an example structure of a sparse regression code.

FIG. 5 illustrates an example structure of a sparse regression code. The embodiment of the sparse regression code 500 shown in FIG. 5 is for illustration only. Other embodiments could be used without departing from the scope of the present disclosure. The sparse regression code 500 includes a number "L" of n×M matrices, denoted as $A_1$ 505, $A_2$ 510, ... $A_L$ 515, respectively. A respective matrix $A_l$ 520 is multiplied with a column vector $\beta_l$ 525.

Figure 6:
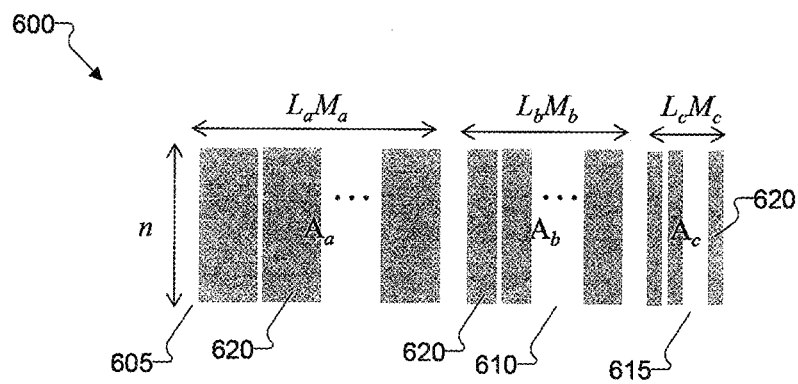
FIG. 6 illustrates a three-layer sparse regression code according to this disclosure.

FIG. 6 illustrates a three-layer sparse regression code according to this disclosure. The embodiment of the three-layer sparse regression code 600 shown in FIG. 6 is for illustration only. Other embodiments could be used without departing from the scope of the present disclosure.

Certain embodiments of the present disclosure utilize a three-layer approach. Matrix A is partitioned into three macro layers: layer a 605, layer b 610 and layer c 615. Each layer includes varying numbers of sections 620 with varying section sizes. More power is allocated to layer a 605 and layer b 610 so that residual errors concentrate in layer c 615. Layer c 615 is interleaved to spread out bursty errors in low power sections. Capacity-approaching error correction codes such as Low Density Parity Check (LDPC) codes are employed to correct residual errors in layer c 615.

Figure 7:
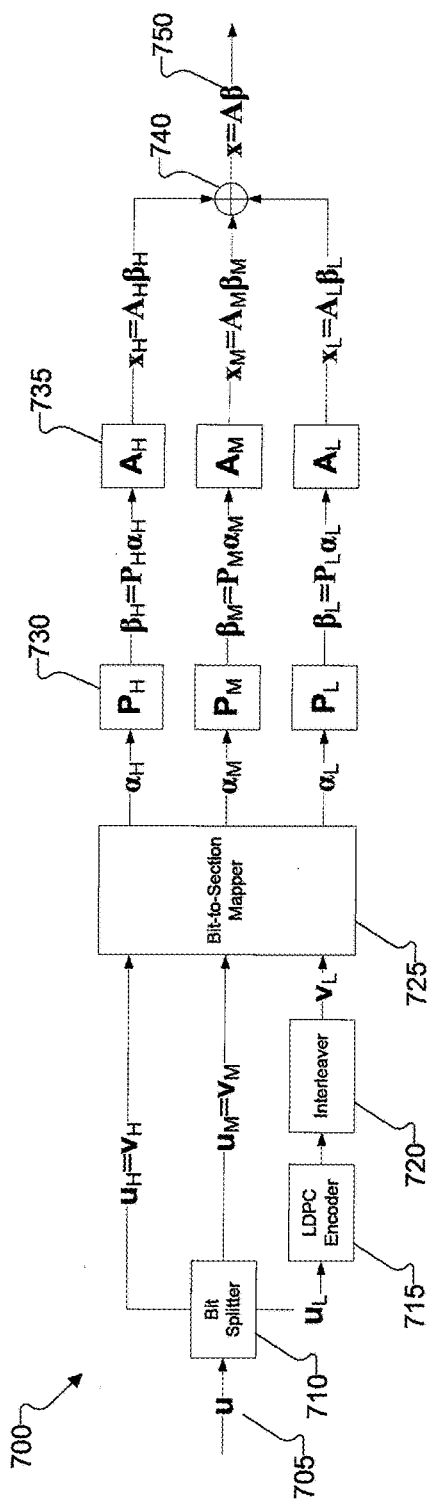
FIG. 7 illustrates a transmitter block diagram according to this disclosure.

FIG. 7 illustrates a transmitter block diagram according to this disclosure. The embodiment of the transmitter 700 shown in FIG. 7 is for illustration only. Other embodiments could be used without departing from the scope of the present disclosure. Transmitter 700 can be implemented in base station 102, such as in TX processing circuitry 315 or RF transceivers 310a-310n. Alternatively, transmitter 700 can be implemented in UE 116, such as in TX processing circuitry 415 or RF transceivers 410a-410n.

The transmitter 700 receives a signal 705 ("u") for transmission. Bit Splitter 710 splits the signal 705 into a number of layers. The layers include an upper layer ($u_H$), a middle layer ($u_M$) and a lower layer ("$u_L$"). The upper layer and middle layer can remain un-coded, namely, $u_H=v_H$ and $u_M=v_M$, as the signal power will be allocated strong enough not to suffer from channel noise. The lower layer is encoded by LDPC encoder 715 and processed by interleaver 720 to produce encoded signal $v_L$. The three signals, $v_H$, $v_M$, and $v_L$ are mapped by Bit-to-Section Mapper 725 and individually allocated power by Power blocks 730 For power allocation, the vectors $\alpha_H$, $\alpha_M$, $\alpha_L$ are multiplied by diagonal matrices $P_H$, $P_M$ $P_L$ to produce the vectors $\beta_H$, $\beta_M$, $\beta_L$, respectively. Thereafter, the signals are multiplied by design matrices $A_H$, $A_M$, $A_L$ to produce signal $x_H$, $x_M$, $x_L$, respectively. Here, $A_H$, $A_M$, $A_L$ are identical to $A_a$, $A_b$, $A_c$ in FIG. 6, respectively. The upper, middle and lower signals from blocks 735 are combined by combiner 740 to produce the transmit signal 750 ("x=A$\beta$"). That is, processing circuitry in the transmitter 700 is configured to divide a data signal into a plurality of layers, allocate power individually to each of the plurality layers, encode a subset of the plurality of layers, the subset comprising a number of layers less than the whole, and interleave the subset of the plurality of layers. The processing circuitry can allocate more power to the upper and middle layers so residual errors concentrate in the lower layer. Thereafter, the lower layer is LDPC encoded to correct residual errors in the lower layer and interleaved to spread-out bursty errors in lower power sections.

Figure 8:
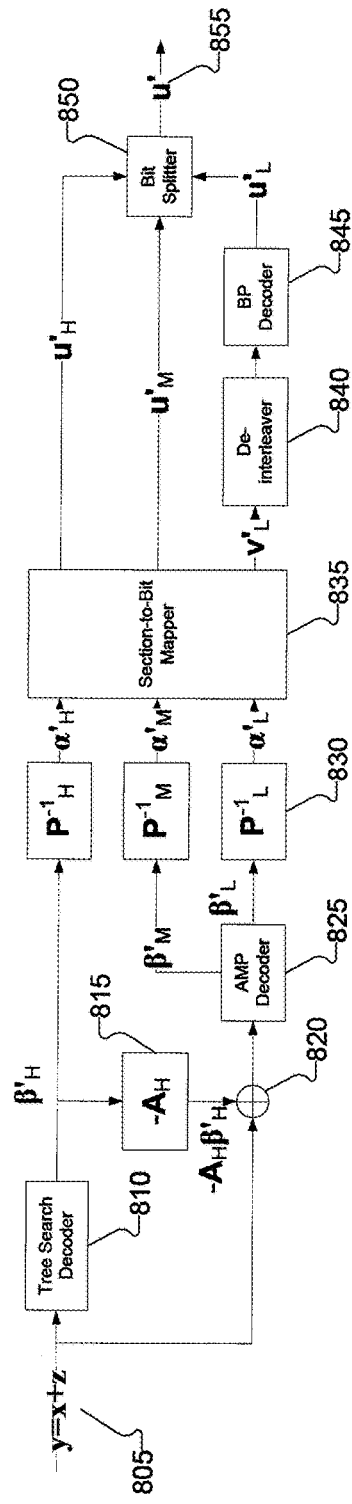
FIG. 8 illustrates a receiver block diagram according to this disclosure.

FIG. 8 illustrates a receiver block diagram according to this disclosure. The embodiment of the receiver 800 shown in FIG. 8 is for illustration only. Other embodiments could be used without departing from the scope of the present disclosure. Receiver 800 can be implemented in base station 102, such as in RX processing circuitry 325 or RF transceivers 310a-310n. Alternatively, receiver 800 can be implemented in UE 116, such as in RX processing circuitry 425 or RF transceivers 410a-410n The receiver 800 receives a signal 805 ("y"), which can be, for example, the transmitted signal 705, namely x plus interference or noise z. Tree search decoder 810 processes the received signal 805 to obtain "$\beta'_H$ Signal," which is an estimation of transmitted signal $\beta_H$. The "$\beta'_H$ Signal" is processed by −A block 815 to produce $-A_H\beta_H$, which is combined with received signal 805 by combiner 820. Block 815 performs matrix multiplication by $-A_H$, such that the estimated upper layer signal is canceled from the received signal in the following adder circuit. The output of combiner 820 is decoded by approximate message passing (AMP) decoder 820, which produces $\beta'_M$ and $\beta'_L$ signals. The estimated signals, $\beta'_H$, $\beta'_M$ and $\beta'_L$, are processed by respective $P^{-1}$ blocks 830. The $P^{-1}$ blocks 830 perform matrix multiplication by the inverse matrix of power allocation matrix $P_H$. The signals output from the $P^{-1}$ blocks 830 are processed by Section-to-Bit Mapper 835 to generate $v_H$, $v_M$, and $v_L$. As indicted with respect to the transmitter 700 shown in FIG. 7, the upper signal matches the upper layer $u_H=v_H$ and the middle signal matches the middle layer $u_M=v_M$. The $v_L$ signal is de-interleaved by de-interleaver 840 and decoded by Belief Propagation (BP) decoder 845 to produce lower layer, $u_L$. Thereafter, bit splitter 850 combines $u_H$, $u_M$ and $u_L$ to construct the original signal, u' 855. That is, processing circuitry in the receiver 800 divides the received data signal into a plurality of layers and performs layer-by-layer decoding on the received data and control signals. The processing circuitry is configured to decode an upper layer by tree-search decoding and decode the middle and lower layers using the AMP decoder 825.

Figure 9:
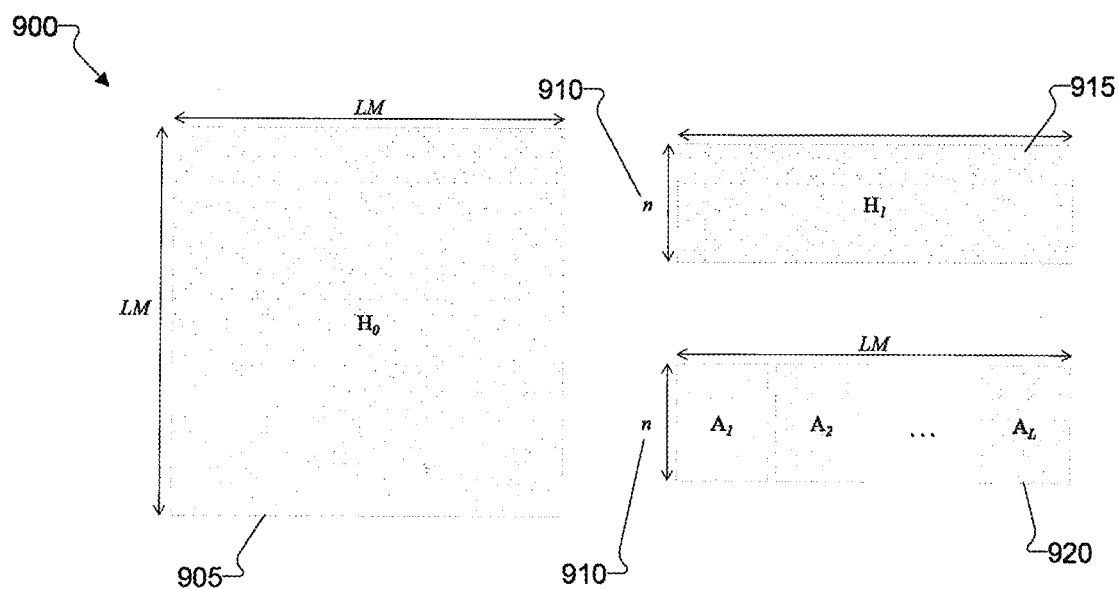
FIGS. 9 and 10 illustrate low complexity Hadamard-based constructions according to this disclosure.

FIG. 9 illustrates a low complexity Hadamard-based construction according to this disclosure. The embodiment of the Hadamard-based construction 900 shown in FIG. 9 is for illustration only. Other embodiments could be used without departing from the scope of the present disclosure.

A first method (Method 1) hadamard-based construction process commences with a LM×LM big hadamard matrix 905, $H_0$. The matrix $H_1$ 915 is made by randomly choosing n rows of the matrix $H_0$ 905. Thereafter, the wide matrix $H_1$ 915 is partitioned into L sections. Each partitioned matrix is n×M as in $A_1-A_L$ 920. The parameters n 910, L, M should meet design rate of R=(L/n) log M For adaptive modulation and coding (AMC) and rateless coding applications, at the time of transmission, the parameters L and M are fixed but n can be left undetermined. The effective blocklength n and the effective code rate R are determined at the time of decoding at the receiver depending upon channel condition.

Figure 10:
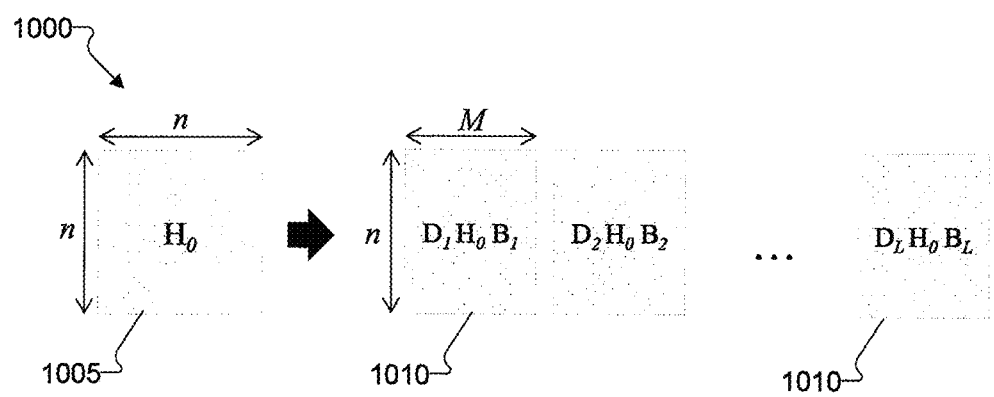

FIG. 10 illustrates another low complexity Hadamard-based construction according to this disclosure. The embodiment of the Hadamard-based construction 1000 shown in FIG. 10 is for illustration only. Other embodiments could be used without departing from the scope of the present disclosure.

A second method (Method 2) hadamard-based construction process commences with a n×n big hadamard matrix 1005, $H_0$. To generate each section matrix 1010, random column permutation by a permutation matrix $B_l$ and random row sign flipping by a diagonal matrix $D_l$ are performed on matrix $H_0$ 1005. In effect, random operations de-correlate sections 1010 and make the sections 1010 near-orthogonal. Thereafter, M columns in each section are chosen to satisfy the design code rate. The transmitter 700 determines code rate by controlling L based on, such as a function of, the CSI feedback.

Figure 11A:
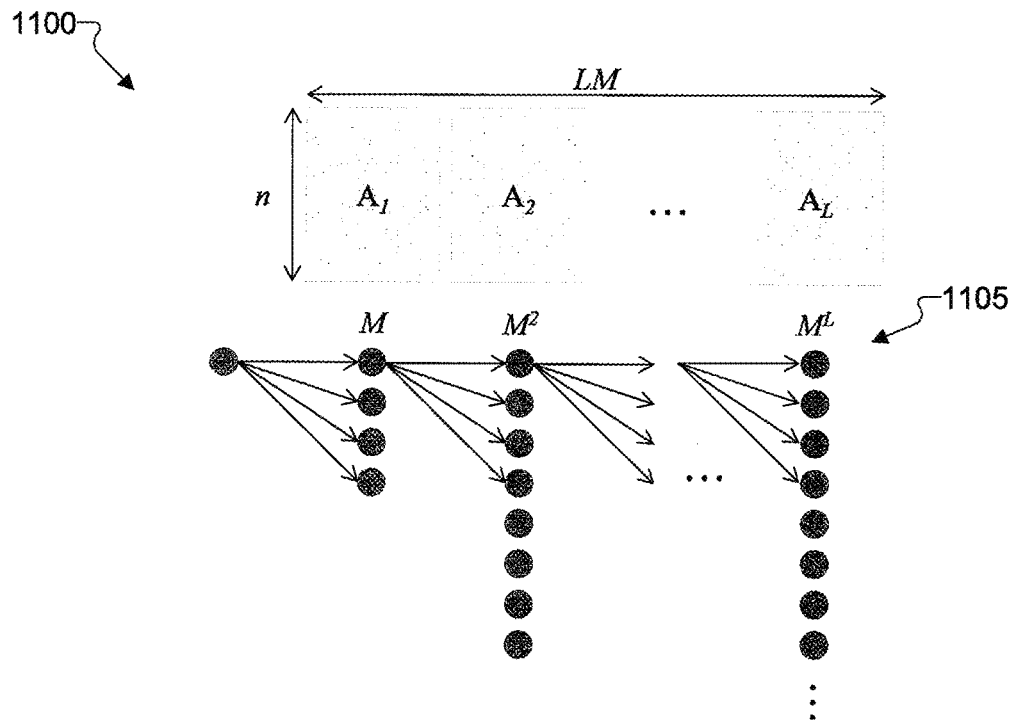
FIGS. 11A and 11B illustrate a tree search sequential decoding process according to this disclosure.
Figure 11B:
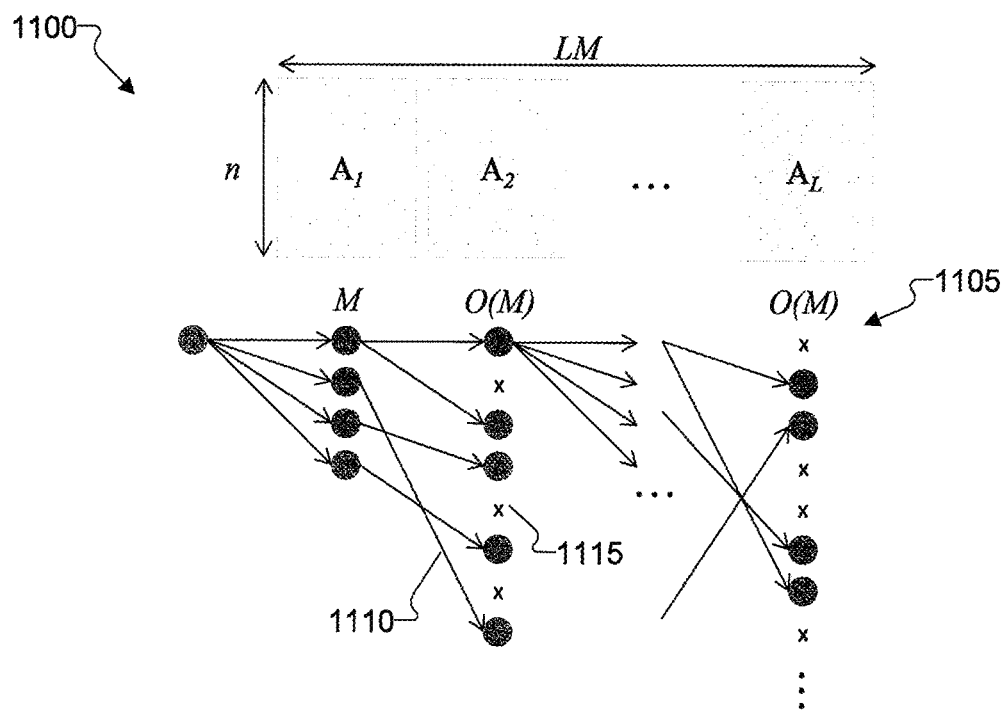

FIGS. 11A and 11B illustrate a tree search sequential decoding process according to this disclosure. The embodiment of the tree search sequential decoding process 1100 shown in FIGS. 11A and 11B is for illustration only. Other embodiments could be used without departing from the scope of the present disclosure.

In certain embodiments, sparse regression codes are represented as a tree 1105. By using the tree search sequential decoding process 1100, the receiver 800 performs ML decoding on full tree paths as shown in FIG. 11A. In certain embodiments, a fixed number of best candidate paths are maintained by tree pruning, as shown in FIG. 11B, to balance between performance and complexity. For example, paths 1110 can be maintained while paths to "x" nodes 1115 are not maintained.

Figure 12:
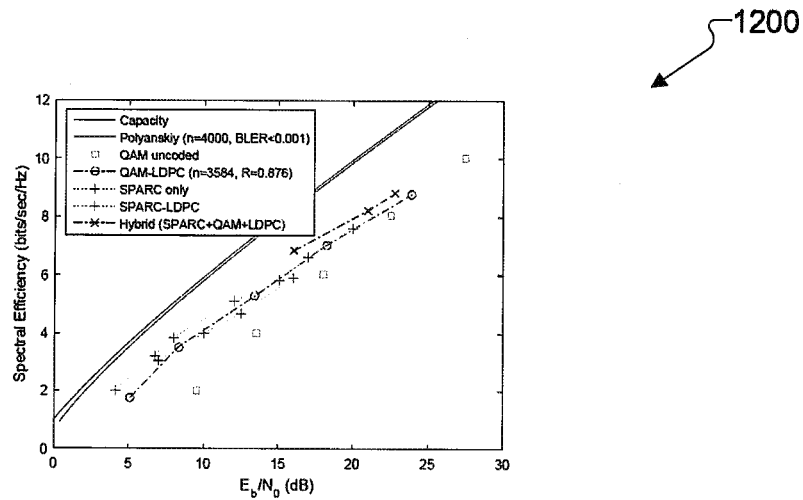
FIGS. 12, 13 and 14 illustrate example results according to this disclosure.
Figure 13:
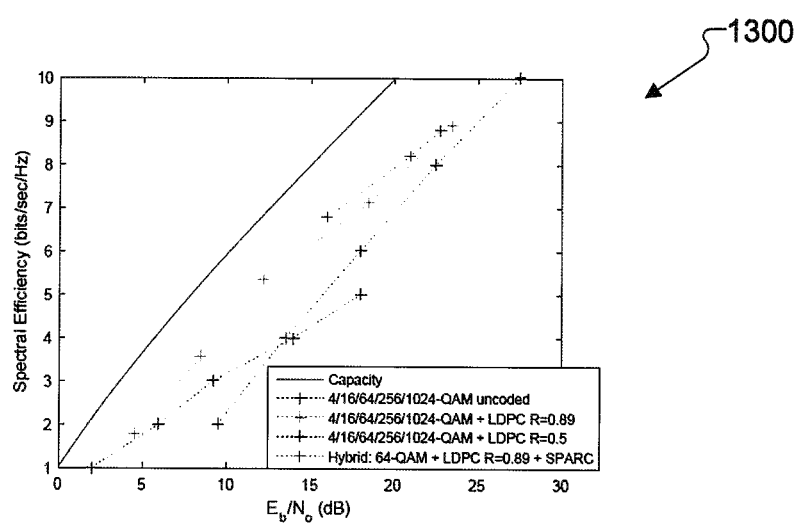
Figure 14:
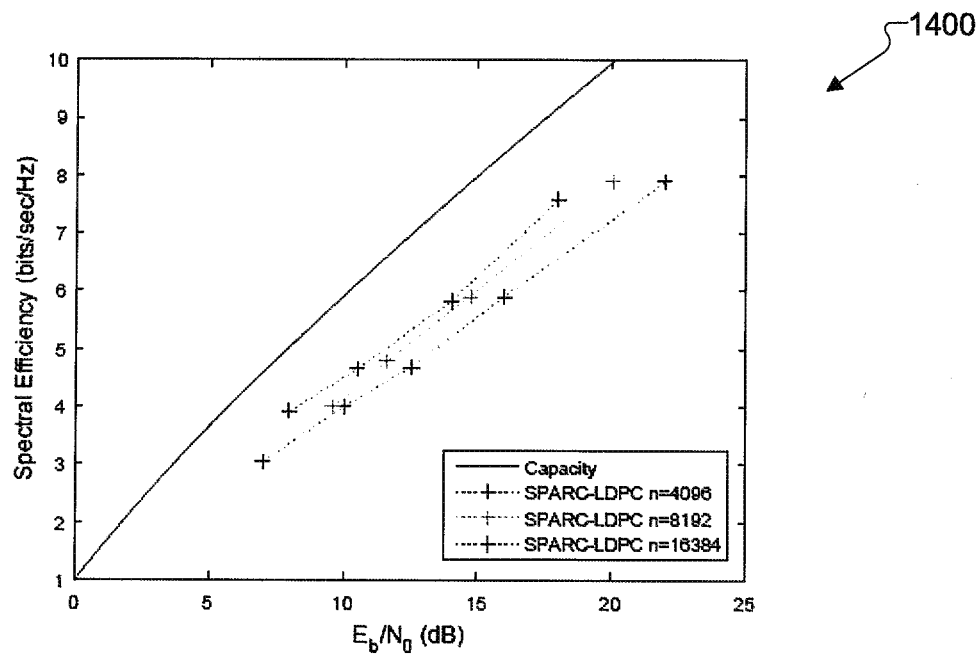

FIGS. 12, 13 and 14 illustrate example results according to this disclosure. The examples shown in FIGS. 12 and 13 are for illustration only. Other embodiments could be used without departing from the scope of the present disclosure.

FIG. 12 illustrates a graph 1200 for spectral efficiency of a hybrid designed precoder using sparse regression codes. In the graph 1200, spectral efficiency $\rho=2R$ at Bit Error Rate (BER)$<10^{-5}$. In one example, a coded modulation architecture using sparse regression codes (SPARC)+sixteen Quadrature Amplitude Modulated (QAM)+LDPC, namely SPARC+16QAM+LDPC, is shown. SPARC+AMP (Sparse Regression Codes with Approximate Message Passing) decoding achieves 70-80% of the capacity.

FIG. 13 illustrates a graph 1300 for hybrid design starting from 1024-QAM+LDPC R=0.89 at Eb/No=23.5 decibels (dB) with a signal to noise ratio (SNR)=33 dB, where Eb denotes average energy per information bit, and No stands for the variance of complex Gaussian noise. When changed to 256-QAM, SNR is reduced by 13.5 dB. Then, the SNR can be allocated to the SPARC layer.

FIG. 14 illustrates another graph 1400 illustrating performance of a hybrid design. The graph 1400 shows that the SPARC+LDPC reach 2.5 dB from Shannon capacity at 4 bits/second/hertz.

Figure 15A:
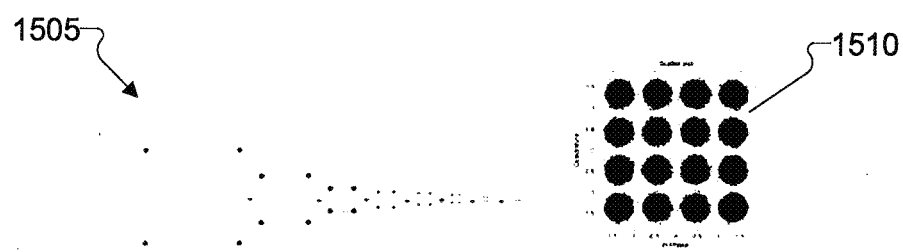
FIGS. 15A and 15B illustrate a signal design according to this disclosure.
Figure 15B:
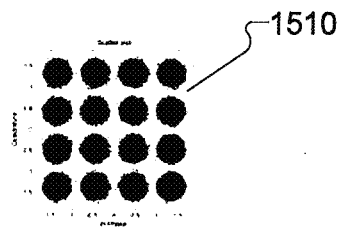

FIGS. 15A and 15B illustrate a signal design according to this disclosure. The embodiment of the signal design shown in FIGS. 15A and 15B are for illustration only. Other embodiments could be used without departing from the scope of the present disclosure.

In the example shown in FIGS. 15A and 15B, the signal is constructed as a n-dimension (n-dim) hadamard signal: $\{-1, +1\}^n$ 1505. In a 2 dimensional (2-D or 2-dim) scatterplot 1510, the n-dim hadamard signal 1505 appears as a QPSK signal $\{-1, +1\}^2$. When three such layers are added with scaling factors $\{4, 2, 1\}$, the sum appears as a 16-QAM signal in 2-dim. For the rest of the layers/sections, exponentially decaying power allocation $P_l \propto \exp(-2Cl/L)$ is used. The sum of those signals appears as a Gaussian signal. Thus, the sum of the hadamard-modulated signals and SPARC signals appears as a 16QAM+Gaussian signal in a 2-dim scatterplot 1510.

Certain embodiments of the present disclosure go from 1024-QAM to 64-QAM+SPARC. Starting from 1014-QAM+LDPC, R=0.89 at Eb/N$_0$=23.5 dB. The SNR is $\rho$Eb/N$_0$=(R log$_2$M)Eb/N$_0$=(0.89 log$_2$(1024))225$\approx$33 dB. A 64-QAM signal requires SINR 20 dB for BER$<10^{-5}$. When $$SINR = \frac{\alpha SNR}{1 + (1-\alpha)SNR}, \alpha \cong 0.99.$$

The $\alpha$SNR is allocated to LDPC-QAM layer and $(1-\alpha)$SNR to SPARC layer. The LDPC-QAM layer is decoded first at SINR 20 dB and canceled. Then, the SPARC signal+noise, operating at $(1-\alpha)$SNR is 13 dB. For example, SPARC can be operated at $\rho=3$ and Eb/N$_0$=8 dB.

According to certain embodiments, a hybrid of SPARC and QAM is advantageous over either SPARC alone or QAM alone. SPARC alone requires very long blocklength to get close to capacity. High-order QAM is not power-efficient due to highly unequal power across the symbol constellation. Lower-order QAM+SPARC is good together because: when decoding QAM first, the SPARC signal appears as Gaussian noise; and the SPARC signal can operate at lower spectral efficiency as compared to SPARC, and which does not require a very long blocklength.

To aid the Patent Office and any readers of any patent issued on this application in interpreting the claims appended hereto, applicants wish to note that they do not intend any of the appended claims or claim elements to invoke 35 U.S.C. §112(f) unless the words "means for" or "step for" are explicitly used in the particular claim. Use of any other term, including without limitation "mechanism," "module," "device," "unit," "component," "element," "member," "apparatus," "machine," "system," "processor," or "controller," within a claim is understood by the applicants to refer to structures known to those skilled in the relevant art and is not intended to invoke 35 U.S.C. §112(f).

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A transmitter comprising:
    a plurality of antenna configured to transmit data and control signals; and
    processing circuitry configured to:
        divide a data signal into a plurality of layers,
        allocate power individually to each of the plurality of layers,
        encode a subset of the plurality of layers, the subset comprising a number of layers less than the whole, and
        interleave the encoded subset of the plurality of layers,
    wherein at least one of:
        the processing circuitry comprises a bit-to-section mapper configured to bit-map the encoded subset of layers and remaining layers of the plurality of layers into a plurality of signals; or
        a Hadamard-based bit-mapping is used to map the plurality of layers into a plurality of signals.

2. The transmitter according to claim 1, wherein the processing circuitry comprises a bit-splitter configured to bit-split the data signal into more than one layers.

3. The transmitter according to claim 1, wherein the processing circuitry is configured to encode the subset of the plurality of layers to produce an encoded layer.

4. The transmitter according to claim 1, wherein encoding the subset of the plurality of layers comprises a capacity-approaching error correction codes encoding.

5. The transmitter according to claim 1, wherein the processing circuitry is configured to allocate more power to upper layer and middle layers of the plurality of signals to concentrate residual errors in a lower layer of the plurality of signals.

6. A method comprising:
    dividing, by a transmitter, a data signal into a plurality of layers;
    allocating power individually to each of the plurality layers;

encoding a subset of the plurality of layers, the subset comprising a number of layers less than the whole;
interleaving the encoded subset of the plurality of layers; and
at least one of:
bit-mapping the encoded subset of layers and remaining layers of the plurality of layers into a plurality of signals; or
a Hadamard-based bit-mapping to map the plurality of layers into a plurality of signals.

7. The method according to claim 6, wherein dividing comprises a bit-splitting, by a bit-splitter, the data signal into at least three layers.

8. The method according to claim 6, wherein encoding comprises encoding the subset of the plurality of layers to produce an encoded layer.

9. The method according to claim 6, wherein encoding a second subset of the plurality of layers comprises a low density parity check (LDPC) encoding.

10. The method according to claim 6, further comprising allocating more power to upper layer and middle layers of the plurality of signals to concentrate residual errors in a lower layer of the plurality of signals.

* * * * *